United States Patent [19]
Hoffman et al.
[11] 3,775,117
[45] Nov. 27, 1973

[54] PROCESS FOR SELECTIVE METALLIZATION OF INSULATING MATERIAL BODIES

[75] Inventors: Herbert Hoffman; Erich Rosshaupter, both of Muenchen; Arthur Weitze, Pullach, all of Germany

[73] Assignee: Siemens Aktiengesellschaft, Berlin and Munich, Germany

[22] Filed: July 13, 1971

[21] Appl. No.: 162,228

Related U.S. Application Data

[63] Continuation-in-part of Ser. No. 853,052, Aug. 26, 1969, abandoned.

[52] U.S. Cl. ...................... 96/36.2, 117/5.5, 117/38, 117/200, 117/212
[51] Int. Cl. ............................................ G03c 5/00
[58] Field of Search ....................... 96/36.2; 117/5.5, 117/47, 38, 200, 212

[56] References Cited

UNITED STATES PATENTS

| | | | |
|---|---|---|---|
| 3,443,988 | 5/1969 | McCormack et al. | 117/212 |
| 3,640,765 | 2/1972 | DeStefano et al. | 96/36.2 |
| 3,619,285 | 11/1971 | Feldstein | 117/212 |
| 2,139,640 | 12/1936 | Mall et al. | 96/36.2 |
| 3,398,010 | 8/1968 | Harvey et al. | 117/5.5 |
| 3,177,085 | 4/1965 | Adams | 117/5.5 |

*Primary Examiner*—Norman G. Torchin
*Assistant Examiner*—Edward C. Kimlin
*Attorney*—Carlton Hill et al.

[57] ABSTRACT

Process for the production of fine-line circuit plates or the like having selected sharply defined metallized areas on an insulating base and the metallized plate so-produced. The process generally comprises applying a layer of a photoresist onto the insulating base and then applying a layer of a light and developer permeable, metallizing ink repellant material (i.e., a silicon oil in xylene) onto the photoresist layer. The coated base is then selectively exposed to light, rendering the exposed photoresist areas chemically changed in its solubility to a suitable developer. The exposed coated base is then contacted with the developer and the soluble photoresist areas are removed, along with the superimposed areas of repellant material supported thereby. The resultant base, having selected areas completely exposed and other areas covered with the non-exposed photoresist and repellant material, is then contacted with a metallizing ink (i.e., an aqueous solution of lithium polymolybdate) and the resultant areas of metallizing ink on the base are air dried. Next, the partially metallized base is annealed at temperatures sufficient to completely remove the remaining photoresist and repellant materials and burn-in the metal on the base.

12 Claims, 7 Drawing Figures

PATENTED NOV 27 1973 3,775,117

INVENTORS
Herbert Hoffmann
Erich Rosshaupter
Arthur Weitze

BY Hill, Sherman, Meroni, Gross & Simpson ATTYS.

PROCESS FOR SELECTIVE METALLIZATION OF INSULATING MATERIAL BODIES

CROSS-REFERENCE TO RELATED APPLICATION

This is a continuation-in-part application of our co-pending application U.S. Ser. No. 853,052 filed Aug. 26, 1969 now abandoned.

BACKGROUND OF THE INVENTION

1. Field of the Invention

This invention relates to selective metallization of areas of an insulating base and to the selectively metallized insulating base so-produced.

2. Prior Art

Methods of selectively metallizing areas of an electrically insulating base are known. German Auslegeschrift (published patent application) No. 1,167,251 suggests such a method wherein areas of a base not to be metallized are coated with a layer of a metallizing ink repellant material and the partially coated base is contacted with a metallizing ink and then dried and annealed. This method is suggested as useful for the production of ceramic capacitors but is not sufficiently precise for the production of fine line metal layer structures such as fine line circuit plates.

Production of selected area metallization on a carrier material is usually carried out with noble metal preparations in a thick-film technique. A screen-printing process is generally employed to achieve the desired patterns and the metal preparations are annealed or burned-in at temperatures ranging between 700° to 1,000° C. However, this method has its drawbacks and fails to meet certain of the thick-film requirements. For example, in certain instances, properties of adhesiveness and galvanizability are not met. In other instances, requirements of vacuum-tightness and hard-solderability are not met. In fact, in a normal case, the last two properties can not be satisfactorily attained at all. Further, this method allows the production of only structures capable of being screen-print produced and extremely fine lined metal structures can not be produced. For example, conductor widths and distances or spacings can not be made narrower than about 100ν with a conventional screen-printing process. Additionally, metallization of holes in the base is only possible with a subsequent brush application step.

French Pat. No. 1,337,121 and French Pat. No. 87,301 (addition to French Pat. 1,337,121) disclosed a process of metallizing surfaces of a ceramic member. The ceramic member is submerged into a solution of a metallizing ink composed of lithium-polymolybdate and the metal coated ceramic body is then subjected to drying, melting (enameling) and burning (annealing) steps. An extreme disadvantage of this process is that only the entire surface of a base can be metallized. Selective metallizing of a surface in accordance with this method can only be accomplished by increasing the viscosity of the metallizing ink, as by the addition of a binder, so as to render it suitable for selective brush or the like application.

SUMMARY OF THE INVENTION

The invention provides a method of selectively metallizing areas of an insulating base so as to produce precise fine line metal layer structures so that the metal layers are characterized by properties of adhesiveness, galvanizability, hard-solderability and vacuum-tightness and the insulating structure having select metallized areas thereon so-produced. The invention also allows metallization of holes or break-throughs in the insulating base.

Generally, the process embodiment of the invention comprises applying a photoresist layer onto a surface of an insulating base and then applying a light and developer permeable metallizing ink repellant material over the photoresist layer. The coated base is then selectively exposed to light rendering the exposed photoresist areas to become chemically changed in its solubility to a suitable developer. The exposed base is then contacted with the developer for removal of the soluble photoresist areas along with the superimposed areas of repellant material. The insulating base, now having selectively uncovered areas, is contacted with a liquid metallizing ink so that a metal layer forms on the uncovered areas. Of course, the metallzing ink is repelled from all other areas by the repellant material. The metal layer is then dried and annealed into the base at temperatures sufficiently high to remove the remaining photoresist and repellant material without leaving any residue on the base and caused a desired bonding between the metal layers and the insulating base.

The article embodiment of the invention comprises of an insulating base having precise fine line metal layer areas thereon produced in accordance with the process embodiment of the invention.

DESCRIPTION OF THE PREFERRED EMBODIMENTS

Figure 1:
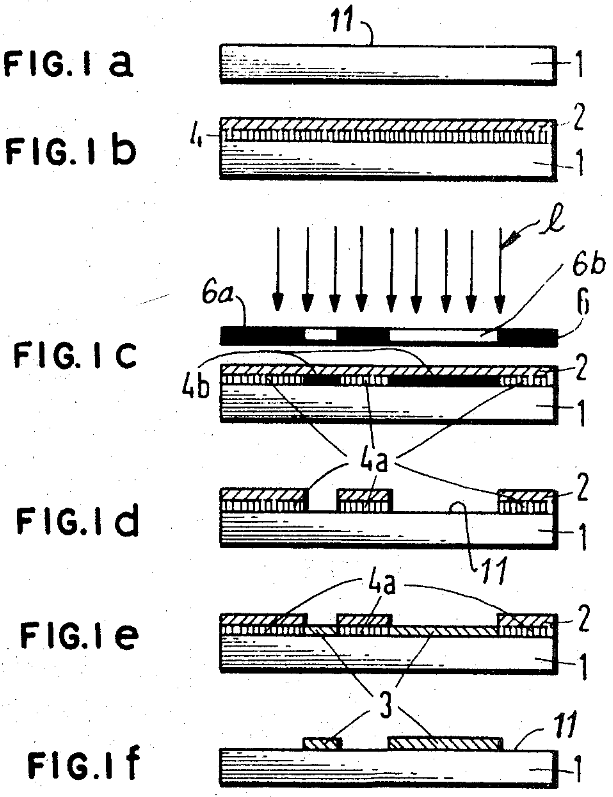
FIG. 1 is a series of sequential pictorial steps FIG. *1a* through FIG. *1f* schematically indicating a typical embodiment of the invention.

The invention provides a process for selected precise metallization of areas on an insulating base and the resultant base having precisely selected metallized areas thereon. The process generally comprises a plurality of sequential steps including coating an electrically insulating base, such as a ceramic, glass, plastic, etc. with a photoresist, such as positive-acting photoresist. The photoresist layer is then overcoated with a light and developer (solvent) permeable metallizing ink repellant material. Precise areas of the coated base are then exposed to light, as by a mask. The light exposure makes the photoresist chemically change in its solubility to its developer so that when the exposed base is brought into contact with such a developer, the soluble photoresist areas and superimposed repellant material areas are precisely removed. The resultant exposed areas of the insulating base are then coated with a metallizing ink to form precise fine line metal layers. The metal layers are annealed at temperatures so as to burn-in metal layers on the base and to completely remove all remaining photoresist and repellant material without any residue.

The insulating base is composed of a wide variety of insulating materials. Typically, the base is composed of various ceramics, such as aluminas or aluminum-magnesium silicates, glass, or a plastic such as polystyrene, ABS (actrylonitrile-butadiene-styrene copolymer), phenolics, etc. and other electrically insulating materials.

The photoresists are photosensitive resins which upon exposure to light of a proper wave length chemically change in their solubility to certain developers or solvents. A wide variety of photoresists are available and generally include a negative-acting type and a positive-acting type. A negative-acting photoresist becomes insoluble to its developer after exposure to light while a positive-acting photoresist becomes soluble to its developer after exposure. Preferably the photoresist utilized in the invention are positive-acting and light exposure makes the photoresist polymer mixture soluble in its development. Typical examples of photoresist materials are vinyl cinnamate copolymers, benzol acetophenones, quaternary salts, azide polymers and others.

Developers (solvent) for photoresists vary in accordance with the nature of the photoresist.

Details on various photoresist and developers is known in the art, for example PRINTED CIRCUIT HANDBOOK (Clyde F. Coombs, Jr. Ed., 1967, McGraw-Hill Book Company) which is incorporated herein by reference.

The light and developer permeable metallizing ink repellant materials are hydrophobic materials that repel aqueous solutions. The repellant materials are characterized by being permeable to light and to the photoresist developers but repelling metallized ink (an aqueous liquid metallizing preparation having a metal-yielding material dissolved therein). Examples of suitable repellant materials include paraffins, waxes, oil, oil-solvent mixtures, plastics and similar hydrophobic materials having the requisite characteristics or properties. A preferred repellant material is a 3 percent silicon oil in xylene mixture but other hydrophobic materials having the requisite characteristics are also useful in the practice of the invention.

Metallizing inks are aqueous solutions containing a metal-yielding material therein (i.e., a metal or metal compound), which releases the metal at elevated temperatures. Suitable metals useful in formulating metallizing inks include molybdenum, titanium, tungsten, noble metals and similar metals or metal compounds. A preferred metallizing ink is an aqueous solution of a lithium-polymolybdate having a stoichiometric composition of 2 $Li_2O \cdot 3\ MoO_3$ adjusted to a density of 1.195 and saturated with lithium fluoride. The preferred metallizing ink is especially useful for dip or submerging coating techniques. The density of the preferred or other metallizing inks is readily modified with a lower aliphatic alcohol, such as methanol. For example, the preferred lithium-molybdate metallizing ink density is modified to 1.20 with methanol for use with other coating techniques, such as a spray technique.

The process embodiment of the invention comprises applying a photoresist, preferably a positive-acting photoresist (i.e., an azide polymer) onto a surface of an insulating base by any suitable method, such as whirl, spray, drip, roller, etc. techniques. An insulating base having holes or breakthrough areas is preferably coated by the air or airless spray techniques. The thickness of the photoresist layer is conventionally controlled and it is preferred to provide a relatively thin uniform layer. The photoresist layer is applied on an entire surface of a base or to selected portions thereof, as by the use of a mask or the like.

A hydrophobic material is superimposed or applied onto a photoresist layer on an insulating base by any suitable method, such as whirl, spray, drip, roller, printing, etc. techniques. A preferred method of applying a layer of repellant material is by means of screen-printing whereby a layer is applied according to the particular pattern or outline on the screen.

The coated insulating base is then exposed to light in selected areas thereof. Where a positive-acting photoresist is utilized, the coated insulating base is exposed to light in those areas thereof that are to be metallized. The light wave length used for exposure ranges from about 200 to about 600 m$\mu$ and the exposure time varies with the thickness and light source intensity but can be readily determined by simple observation.

The exposed areas of the photoresist undergo a chemical change and with a positive-acting photoresist become soluble in their developer. The insulating base having selectively exposed photoresist areas is then contacted with a developer for the photoresists for precise removal of the soluble areas of the photoresist (the exposed areas of a positive-acting photoresist and unexposed areas of negative-acting photoresist). Since the hydrophobic material overlayer is permeable to the developer, it readily passes through this outer coating and dissolved soluble photoresist areas. Of course, the non-soluble areas of the photoresist are not effected by the developer. Removal of the soluble photoresist areas causes the superimposed hydrophic material areas to be likewise removed. The developer itself does not affect the hydrophobic material and it remains in position on the non-soluble photoresist areas.

The metallizing ink is then applied by a suitable coating technique onto the insulating base, now having selected exposed areas. The liquid metallizing ink adheres to the exposed base areas and is repelled from the other areas by the outer layer of hydrophobic material. The applied ink is then air-dried and the thus prepared insulating base is then subjected to annealing conditions sufficient to release the metal from the ink and to burn-in the metal onto the insulating base and to completely remove, without residue, the remaining areas of photoresist and repellant material.

More specifically, the annealing include subjecting the prepared insulating base to temperatures in the range of about 1,350° to 1,600° for a period of time sufficient to burn-in the metal layer and remove the photoresist and repellant material, which generally ranges from about 5 to about 30 minutes. The specific time-temperature combination varies in accordance with the nature of the base utilized. Preferably, the annealing process takes place in the reducing atmosphere, such as dry (having a dew point of less than −20° C.) hydrogen gas. The reducing atmosphere is passed continuously over the insulating base being annealed throughout the entire annealing process thereby guaranteeing the preservation of the formed fine-line metal layer structure.

In accordance with the principles of the invention, a final article having precisely defined fine-line metal layers on surfaces thereof is achieved. The articles produced by the process of the invention are characterized by having metal layers tightly bonded (i.e., having extreme adhesiveness) to an insulating base, capable of being hard-soldered, having improved galvanizability and providing better vacuum tightness than heretofore available. For example, housings for construction elements are readily soldered in a vacuum-tight manner onto the structures produced in accordance with the principles of the invention.

An exemplary embodiment of the invention is schematically indicated at FIG. 1*a* through FIG. 1*f*, but it will be understood that this does not limit the invention.

As illustrated in FIG. 1*a*, an insulating base 1, such as of ceramic, glass or plastic was first prepared for coating by cleansing it with a suitable cleansing agent, such as a degreasing material, an acid, a base, etc. so as to render a surface 11 thereof receptive of the photoresist coating.

Then, as shown in FIG. 1*b*, a positive-acting photoresist, such as AZ-340 (a tradename of Azoplate Positop for a positive-acting azide polymer containing photoresist) was applied as a uniform layer 4 on the surface 11 of the base 1. While the holes or break-throughs are not shown, the peripheral walls thereof are similarly coated. Superimposed onto the photoresist layer 4 was a layer 2 of a hydrophobic material characterized as being light and developer permeable and preferably comprising an oil-solvent mixture, i.e., a 3 percent silicon-oil xylene mixture.

As illustrated in FIG. 1*c*, a means 6 for selectively exposing areas of the coated base was provided. For example, a mask means 6 having a pattern of light-transmitting areas 6*b* and light-blocking areas 6*a* was positioned above the coated base and light rays 1 were passed through the mask means 6 so as to impinge upon selected areas of the base. The layer 2 is light-permeable and allows the light rays 1 to contact the photoresist layer 4. The photoresist areas exposed to light, such as areas 4*b*, were chemically changed to be soluble in its photoresist developer while the photoresist areas not exposed to light, such as areas 4*a*, remained insoluble in the developer. In this manner very precise patterns were obtained.

Then, as shown in FIG. 1*d*, a developer for the photoresist, such as AZ-300 (a tradename of Azoplate Positop for exposed AZ-340, generally comprising an alkaline-water solution) was brought into contact with the exposed photoresist and quickly and precisely dissolved the exposed photoresist areas 4*b* from the base thereby exposing corresponding portions of the surface 11. Of course, the areas of layer 2 corresponding to the areas 4*b* of layer 4 are also removed.

Then a metallizing ink (such as the earlier described liquid lithium-polymolybdate solution) was brought into contact with the partially coated base structure illustrated at FIG. 1*d* so as to form a metal layer 3 in the exposed areas, as illustrated at FIG. 1*e*.

Thereafter, the metal layer was air-dried and subjected to annealing conditions earlier described so as to yield a finished structure such as illustrated at FIG. 1*f* having precise fine-line metal layers 3 on a surface 11 of an insulating base 1. The unexposed photoresist areas 4*a* and corresponding areas of repellant material layer 2 are completely removed by the annealing process and leave no residue on the base.

It will be understood that modifications and variations may be effected without departing from the spirit and scope of the novel concepts of the present invention.

We claim as our invention:

1. A method of select metallization of a surface on an insulating base consisting essentially of the steps of:

coating a surface of said insulating base with a layer of a photoresist;

superimposing a layer of a hydrophobic material onto said photoresist layer, said hydrophobic material being characterized as permeable to light and to a developer for said photoresist while being repellant to an aqueous solution;

exposing select areas of the surface coated with superimposed layers of photoresist and hydrophobic material to light so that areas of said photoresist layer corresponding to said select areas are exposed thereby producing an exposed coated base, said exposed areas of the photoresist layer undergoing a chemical change which allows the photoresist layer to be developed by a suitable developer;

contacting said exposed coated base with a developer for said photoresist for removal of soluble areas of the photoresist layer and superimposed areas of hydrophobic material so as to expose areas of said base corresponding to said select areas and thereby produce a partially coated base;

coating said partially coated base with an aqueous solution containing a metal-yielding material so that a layer of said solution forms only on the exposed areas of said base; and subjecting the resultant base to annealing conditions sufficient to release the metal from said metal-yielding material onto the base areas corresponding to said select areas and to burn-in said metal onto said base areas while removing remaining photoresist and hydrophobic material from said base.

2. A method as defined in claim 1 wherein the photoresist is a positive-acting photoresist.

3. A method as defined in claim 1 wherein the hydrophobic material is applied by means of screen printing.

4. A method as defined in claim 1 wherein the hydrophobic material is selected from the group consisting of paraffins, waxes, oils, oil-solvent mixtures and plastics characterized by the properties of being permeable to light and to developers for photoresist.

5. A method as defined in claim 4 wherein the hydrophobic material is essentially a silicon oil-xylene mixture.

6. A method as defined in claim 1 wherein the aqueous solution includes lithium fluoride in an amount sufficient to substantially saturate said solution and includes a lithium-polymolybdate having a stoichiometric composition of $2LiO_2 \cdot 3MoO_3$.

7. A method as defined in claim 1 wherein the aqueous solution includes a lower aliphatic alcohol for adjusting the density of said solution.

8. A method as defined in claim 7 wherein the density of the aqueous solution is about 1.195.

9. A method as defined in claim 7 wherein the density of the aqueous solution is about 1.20.

10. A method as defined in claim 1 wherein the annealing conditions include passing a reducing atmosphere over the resultant base structure and subjecting said structure to temperatures in the range of about 1,350° to about 1,600° C. for a period of time ranging from about 5 to about 30 minutes.

11. A method of select metallization of a surface of an insulating base consisting essentially of the steps of:

coating a surface of said insulating base with a layer of a positive-acting photoresist;

superimposing a layer of a hydrophobic material onto said layer of photoresist, said hydrophobic material comprising a silicon oil-solvent mixture;

exposing select areas of the surface coated with superimposed layers of photoresist and hydrophobic material to light so that areas of said photoresist layer corresponding to select areas are exposed thereby producing an exposed coated base, said exposed areas of the photoresist layer undergoing a chemical change so as to become soluble in a suitable developer and allowing the photoresist layer to be developed by said developer;

contacting said exposed coated base with a developer for said photoresist for removal of soluble areas of the photoresist layer and superimposed areas of the hydrophobic material so as to expose areas of said base corresponding to said select areas and thereby produce a partially coated base;

coating said partially coated base with an aqueous solution of lithium-polymolybdate having a stoichiometric composition of $2LiO_2 \cdot 3MoO_3$ and an amount of lithium fluoride sufficient to substantially saturate said solution, so that a layer of said solution forms only on the exposed areas of said base;

drying said solution on the exposed areas of said base; and substantially simultaneously passing a reducing atmosphere of a dry hydrogen gas having a dew point of less than −20° C. over the resultant base and subjecting said base to temperatures in the range of about 1,350° to about 1,600° C. for a period of time ranging from about 5 to 30 minutes so as to burn-in the metal from said solution onto the insulating base and completely remove the remaining photoresist and repellant material from said base.

12. A method as defined in claim 11 wherein the hydrophobic material is a 3 percent silicon oil in xylene mixture.

* * * * *